(12) United States Patent
Zhou et al.

(10) Patent No.: US 11,139,783 B2
(45) Date of Patent: Oct. 5, 2021

(54) CIRCUIT STRUCTURE AND METHOD FOR IMPROVING HARMONIC SUPPRESSION CAPABILITY OF RADIO FREQUENCY POWER AMPLIFIER

(71) Applicant: Lansus Technologies Inc., Guangdong (CN)

(72) Inventors: Jiahui Zhou, Guangdong (CN); Bin Hu, Guangdong (CN); Jiashuai Guo, Guangdong (CN); Kai Xuan, Guangdong (CN); Hua Long, Guangdong (CN)

(73) Assignee: LANSUS TECHNOLOGIES INC, Shenzhen (CN)

( * ) Notice: Subject to any disclaimer, the term of this patent is extended or adjusted under 35 U.S.C. 154(b) by 23 days.

(21) Appl. No.: 16/630,513

(22) PCT Filed: Oct. 19, 2017

(86) PCT No.: PCT/CN2017/106825
§ 371 (c)(1),
(2) Date: Jan. 13, 2020

(87) PCT Pub. No.: WO2019/010858
PCT Pub. Date: Jan. 17, 2019

(65) Prior Publication Data
US 2020/0169224 A1 May 28, 2020

(30) Foreign Application Priority Data
Jul. 12, 2017 (CN) .......................... 201710565262.6

(51) Int. Cl.
*H03F 3/191* (2006.01)
*H03F 1/26* (2006.01)
*H03F 3/21* (2006.01)

(52) U.S. Cl.
CPC ................. *H03F 1/26* (2013.01); *H03F 3/21* (2013.01); *H03F 2200/171* (2013.01);
(Continued)

(58) Field of Classification Search
CPC ............. H03F 1/56; H03F 3/191; H03F 3/193
(Continued)

(56) References Cited

U.S. PATENT DOCUMENTS

2007/0176688 A1* 8/2007 Frei ........................... H03F 1/56
330/302
2009/0167438 A1 7/2009 Yang et al.

FOREIGN PATENT DOCUMENTS

CN 102270967 A 12/2011
CN 203590161 U 5/2014
(Continued)

OTHER PUBLICATIONS

Derwent 2016-70539P, abstract for WO 2018/006482. (Year: 2019).*
Int'l Search Report dated Apr. 12, 2018 in Int'l Application No. PCT/CN2017/106825.

*Primary Examiner* — Steven J Mottola
(74) *Attorney, Agent, or Firm* — Panitch Schwarze Belisario & Nadel LLP

(57) ABSTRACT

A circuit structure for improving the harmonic suppression capability of a radio frequency power amplifier includes an output stage unit, a high-order harmonic suppression unit, and a low-order harmonic suppression unit. The output stage unit outputs a signal to be subjected to harmonic suppression; the high-order harmonic suppression unit comprises a first filter capacitor and a back hole, and is used for suppressing fifth or higher harmonics; the output stage unit and the first filter capacitor are connected to the ground in series by means of the back hole; the low-order harmonic suppression unit is connected to the output stage unit to suppress second, third and fourth harmonics. According to the design, (Continued)

the high-harmonic suppression capability of the radio frequency power amplifier is improved.

8 Claims, 2 Drawing Sheets

(52) U.S. Cl.
CPC .. *H03F 2200/225* (2013.01); *H03F 2200/387* (2013.01); *H03F 2200/451* (2013.01)

(58) Field of Classification Search
USPC .................................................. 330/302–307
See application file for complete search history.

(56) References Cited

FOREIGN PATENT DOCUMENTS

| | | | |
|---|---|---|---|
| CN | 104579189 A | 4/2015 | |
| CN | 106656069 A | 5/2017 | |
| WO | WO-2018006482 A1 * | 1/2018 | ............... H03F 1/56 |

* cited by examiner

CIRCUIT STRUCTURE AND METHOD FOR IMPROVING HARMONIC SUPPRESSION CAPABILITY OF RADIO FREQUENCY POWER AMPLIFIER

CROSS-REFERENCE TO RELATED APPLICATIONS

This application is a Section 371 of International Application No. PCT/CN2017/106825, filed Oct. 19, 2017, which was published in the Chinese language on Jan. 17, 2019, under International Publication No. WO 2019/010858 A1, which claims priority under 35 U.S.C. § 119(b) to Chinese Application No. 201710565262.6, filed Jul. 12, 2017, the disclosures of all of which are incorporated herein by reference in their entirety.

TECHNICAL FIELD

The present invention relates to a circuit structure and method for suppressing harmonics, in particular to a circuit structure and method for improving the harmonic suppression capability of a radio frequency power amplifier.

BACKGROUND

As one important constituent part of transmitting equipment, radio frequency power amplifiers have the principal technical indicators of output power and efficiency. In addition, the harmonic component in an output should be as small as possible to avoid interferences on other channels. Traditional radio frequency power amplifiers adopt a low-pass three-section LC matching structure to realize output matching. However, such matching structure has a limited capability to suppress harmonics of the radio frequency power amplifiers, and even if a harmonic suppression network is added into a chip Die, only the capability to suppress low-order harmonics can be improved, and the capability to suppress high-order harmonics still remains limited.

SUMMARY

The present invention provides a circuit structure for improving the harmonic suppression capability of a radio frequency power amplifier. According to the circuit structure for improving the harmonic suppression capability of a radio frequency power amplifier, a resonant network is added into a chip Die of a radio frequency power amplifier, and high-order harmonics are suppressed by means of the resonant effect of a capacitor and a back hole, so that a harmonic suppression effect better than that of the traditional low-pass three-section LC matching network is obtained.

The circuit structure for improving the harmonic suppression capability of a radio frequency power amplifier of the present invention comprises an output stage unit, a high-order harmonic suppression unit, and a low-order harmonic suppression unit;

The output stage unit outputs a signal to be subjected to harmonic suppression;

The high-order harmonic suppression unit is used for suppressing fifth or higher harmonics and comprises a first filter capacitor and a back hole; the output stage unit and the first filter capacitor are connected to the ground in series by means of the back hole;

The low-order harmonic suppression unit is electrically connected to the output stage unit to suppress second, third and fourth harmonics and comprises a second filter capacitor, a fourth resonant inductor, a first matching inductor, a second matching inductor, a third matching inductor, a first matching capacitor, a second matching capacitor, a third matching capacitor, a first resonant inductor, a second resonant inductor, and a third resonant inductor, wherein:

The second filter capacitor is connected to the ground in series by means of the fourth resonant inductor; the first matching inductor is connected to the output stage unit and is then connected with the second matching inductor and the third matching inductor in series to an output terminal;

The first matching capacitor and the first resonant inductor are connected to the ground in series and are connected between the first matching inductor and the second matching inductor in parallel;

The second matching capacitor and the second resonant inductor are connected to the ground in series and are connected between the second matching inductor and the third matching inductor in parallel;

The third matching capacitor and the third resonant inductor are connected to the ground in series and are connected between the third matching inductor and the output terminal in parallel.

The first filter capacitor is arranged at the back hole, the output stage unit, the high-order harmonic suppression unit and the second filter capacitor are arranged on a chip Die, and the fourth resonant inductor is realized by means of a gold wire.

The present invention further provides a method for improving the harmonic suppression capability of a radio frequency power amplifier by means of the circuit structure mentioned above. The method comprises the following steps:

Step 1: High-Order Harmonic Suppression;

Specifically, the output stage unit and the first filter capacitor of the radio frequency power amplifier are connected to the ground in series by means of the back hole, and the first filter capacitor and the back hole constitute a resonant network in the chip Die to suppress fifth or higher harmonics of the radio frequency power amplifier;

Step 2: Low-Order Harmonic Suppression;

Specifically, the low-order harmonic suppression unit is connected to the output stage unit to suppress second, third and fourth harmonics.

In the step of low-order harmonic suppression, the low-order harmonic suppression unit comprises a second filter capacitor, a fourth resonant inductor, a first matching inductor, a second matching inductor, a third matching inductor, a first matching capacitor, a second matching capacitor, a third matching capacitor, a first resonant inductor, a second resonant inductor and a third resonant inductor; and specific steps for low-order harmonic suppression are as follows:

Fourth Harmonic Suppression:

Specifically, the second filter capacitor is connected to the ground in series by means of the fourth resonant inductor and the second filter capacitor and the fourth resonant inductor constitute a resonant network to suppress fourth harmonics;

The first matching inductor is connected to the output stage unit and is then connected with the second matching inductor and the third matching inductor in series to an output terminal;

Second Harmonic Suppression:

Specifically, the first matching capacitor and the first resonant inductor are connected to the ground in series and are connected between the first matching inductor and the second matching inductor in parallel; the second matching capacitor and the second resonant inductor are connected to the ground in series and are connected between the second matching inductor and the third matching inductor in parallel; second harmonics are suppressed by means of the first matching capacitor, the first resonant inductor, the second matching capacitor and the second resonant inductor which resonate at a second-order harmonic frequency point;

Third Harmonic Suppression:

Specifically, the third matching capacitor and the third resonant inductor are connected to the ground in series and are connected between the third matching inductor and the output terminal in parallel, and third harmonics are suppressed by means of the third matching capacitor and the third resonant inductor which resonate at a third-order harmonic frequency point.

In the step of high-order harmonic suppression, the first filter capacitor is arranged at the back hole, the output stage unit, the high-order harmonic suppression unit and the second filter capacitor are arranged on a chip Die, and the fourth resonant inductor is realized by means of a gold wire.

Compared with the prior arts, the present invention has the following advantages:

The circuit structure for improving the harmonic suppression capability of a radio frequency power amplifier of the present invention guarantees the area of the chip Die and improves the high-harmonic suppression capability of the radio frequency power amplifier.

The circuit structure for improving the harmonic suppression capability of a radio frequency power amplifier of the present invention is simple and easy to implement.

DETAILED DESCRIPTION OF EMBODIMENTS

The specific implementations of the present invention are further detailed below in combination with the accompanying drawings and embodiments to provide a better understanding of the solutions and advantages of the present invention. However, the specific implementations and embodiments in the following description are only for the purpose of explanation, and are not intended to limit the invention.

Figure 1:
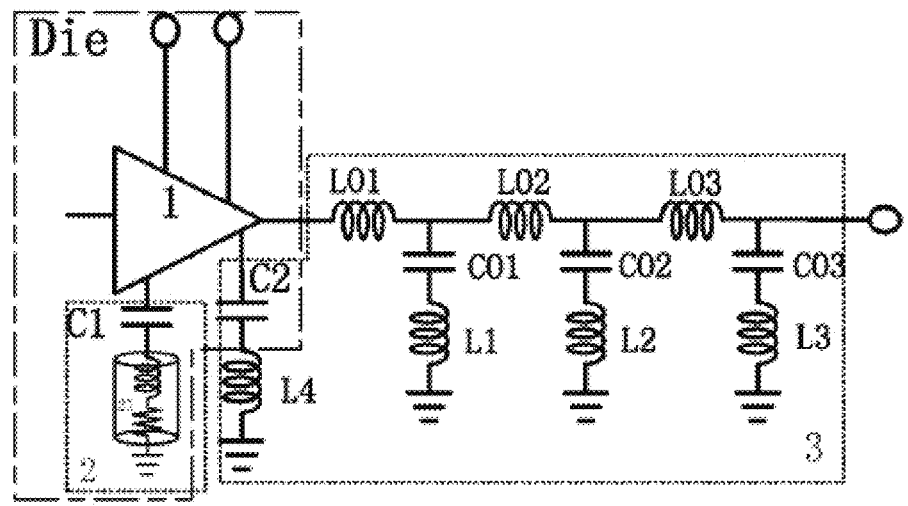
FIG. 1 shows an output matching, circuit structure of a radio frequency power amplifier of the present invention.

Referring to FIG. 1, a circuit structure for improving the harmonic suppression capability of a radio frequency power amplifier comprises an output stage unit 1, a high-order harmonic suppression unit 2, and a low-order harmonic suppression unit 3.

Wherein, the output stage unit 1 outputs a signal to be subjected to harmonic suppression.

The high-order harmonic suppression unit 2 is used for suppressing fifth or higher harmonics and comprises a first filter capacitor C1 and a back hole 21. The output stage unit 1 and the first filter capacitor C1 are connected to the ground in series by means of the back hole 21. The low-order harmonic suppression unit 3 is electrically connected to the output stage unit 1 to suppress second, third and fourth harmonics.

The low-order harmonic suppression unit 3 comprises a second filter capacitor C2, a fourth resonant inductor L4, a first matching inductor L01, a second matching inductor L02, a third matching inductor L03, a first matching capacitor C01, a second matching capacitor C02, a third matching capacitor C03, a first resonant inductor L1, a second resonant inductor L2, and a third resonant inductor L3, wherein the second filter capacitor C2 is connected to the ground in series by means of the fourth resonant inductor L4, the first matching inductor L01 is connected to the output stage unit 1 and is then connected with the second matching inductor L02 and the third matching inductor L03 in series to an output terminal, the first matching capacitor C01 and the first resonant inductor L1 are connected to the ground in series and are connected between the first snatching inductor L01 and the second matching inductor L02 in parallel, the second matching capacitor C02 and the second resonant inductor L2 are connected to the ground in series and are connected between the second matching inductor L02 and the third matching inductor L03 in parallel, and the third matching capacitor C03 and the third resonant inductor L3 are connected to the ground in series and are connected between the third matching inductor L03 and the output terminal in parallel.

In addition, the first filter capacitor C1 is arranged at the back hole 21, the output stage unit 1, the high-order harmonic suppression unit 2 and the second filter capacitor C2 are arranged on a chip Die, and the fourth resonant inductor L4 is realized by means of a gold wire.

The present invention further provides a method for suppressing harmonics by means of the harmonic suppression circuit shown in FIG. 1. The method comprises the following steps:

Step 1: High-Order Harmonic Suppression;

Specifically, the output stage unit 1 and the first filter capacitor C1 are connected to the ground in series by means of the back hole 21, and the first filter capacitor C1 and the back hole 21 constitute a resonant network in the chip Die to suppress fifth or higher harmonics of the radio frequency power amplifier.

The resonant network is realized mainly in such a manner: the first filter capacitor C1 is designed at the back hole 21, and the resonant network is formed by means of the parasitic inductance of the first filter capacitor C1 and the back hole 21, and the first filter capacitor C1. Because the parasitic inductance of the back hole 21 is small, the Q value of the quality factor of the first filter capacitor C1 on the chip Die is large, and deep resonance and filter can be easily formed at a high-frequency part to effectively suppress high-order harmonics of the radio frequency power amplifier. Because the first filter capacitor C1 itself is designed at the back hole 21, the configuration of the first filter capacitor C1 will not increase the area of the chip Die.

Step 2: Low-Order Harmonic Suppression;

Specifically, the low-order harmonic suppression unit 2 is electrically connected to the output stage unit 1 to suppress second, third and fourth harmonics.

A. Fourth Harmonic Suppression:

Specifically, the second filter capacitor C2 is connected to the ground in series by means of the fourth resonant inductor L4, and the second filter capacitor C2 and the fourth resonant inductor L4 constitute a resonant network to suppress fourth harmonics.

B. Second Harmonic Suppression:

Specifically, second harmonics are suppressed by means of the first matching capacitor C01, the first resonant inductor L1, the second matching capacitor C02 and the second resonant inductor L2 which resonate at a second-order harmonic frequency point.

C. Third Harmonic Suppression:

Third harmonics are suppressed by means of the third matching capacitor C03 and the third resonant inductor L03 which resonate at a third-order harmonic frequency point.

In addition, the first filter capacitor C1 is arranged at the back hole 21, the output stage unit 1, the high-order harmonic suppression unit 2 and the second filter capacitor C2 are arranged on a chip Die, and the fourth resonant inductor L4 is realized by means of a gold wire.

Figure 2:
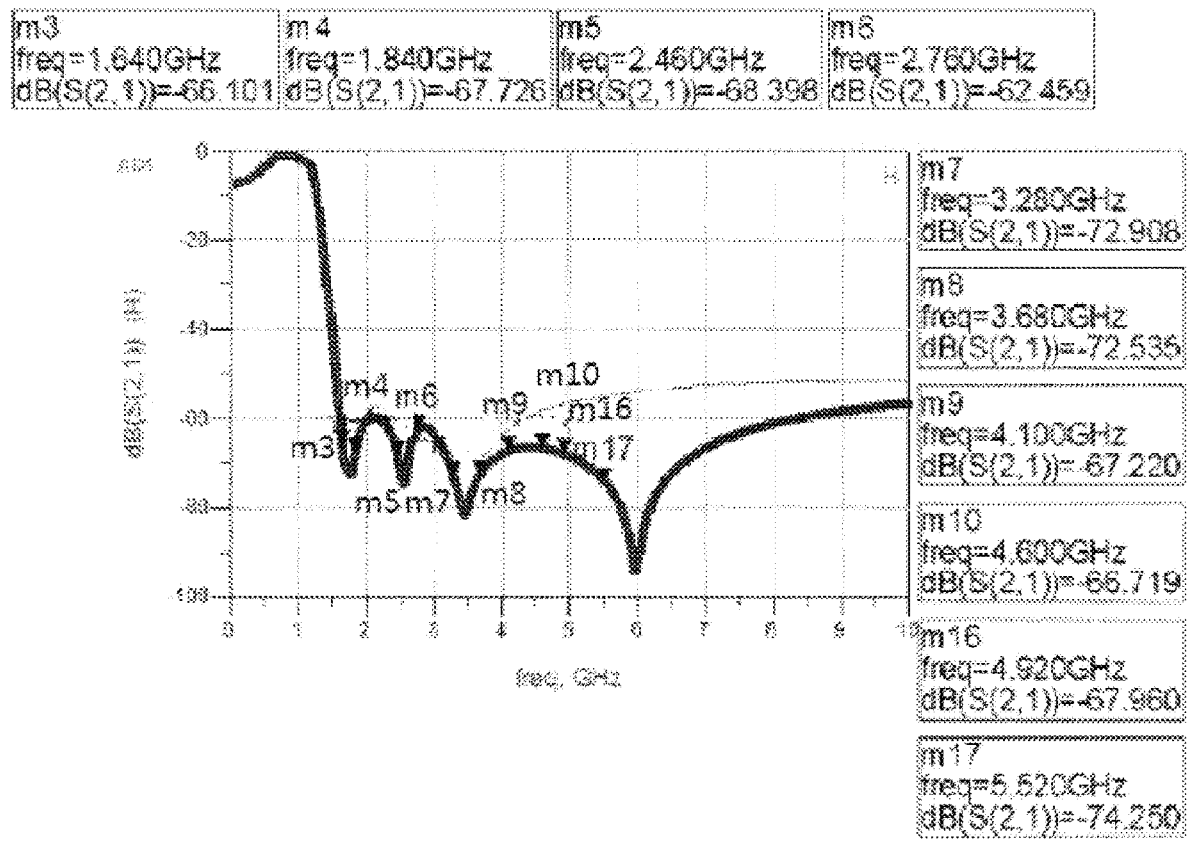
FIG. 2 is a comparative simulation chart of the harmonic suppression capacity of the harmonic suppression capacity of the output matching structure of a radio frequency power amplifier of the present invention and a traditional output matching structure of a radio frequency power amplifier.

FIG. 2 is a comparative simulation chart of the harmonic suppression capacity of the harmonic suppression capacity of the output matching structure of the radio frequency power amplifier of the present invention and a traditional output matching structure of the radio frequency power amplifier, wherein the thin curve represents a simulation result of the traditional structure, and the thick curve represents a simulation result of the circuit structure of the present invention. As can be clearly seen from FIG. 2, the circuit structure of the present invention has a superior harmonic suppression capability and particularly can obviously suppress m9, m10, m16 and m17 high-order harmonics.

Figure 3:
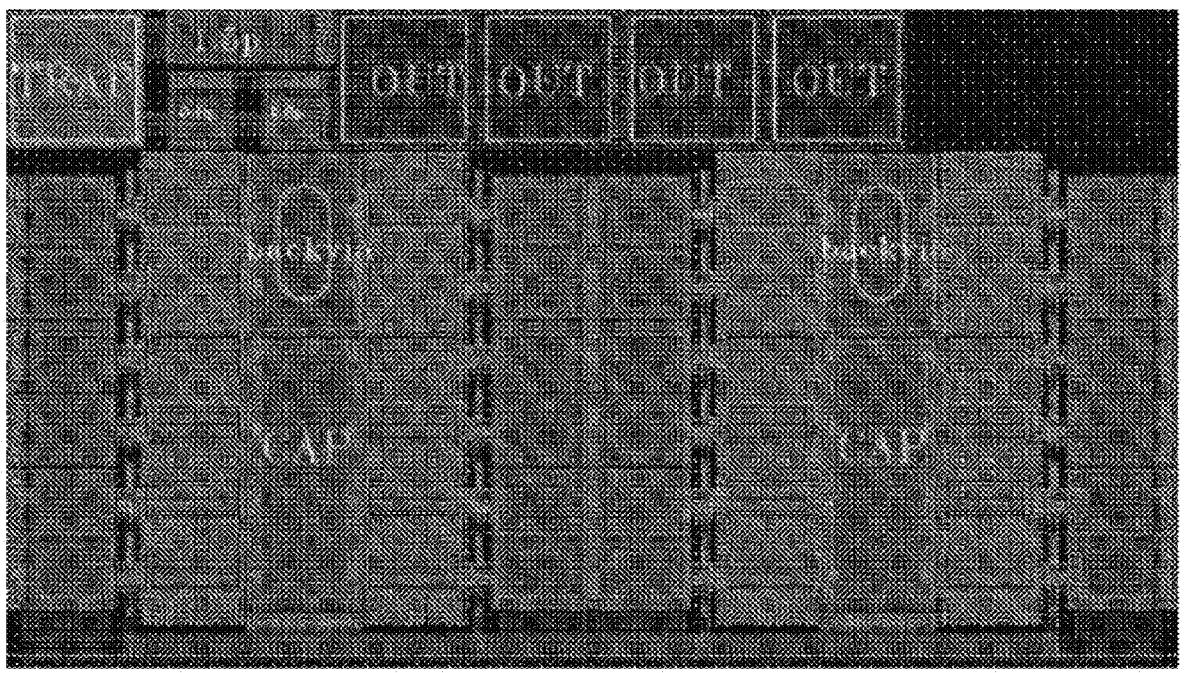
FIG. 3 shows a specific implementation of the internal design of DIE of the present invention.

As shown in FIG. 3 which is a specific implementation of the internal design of the DIE of the present invention, the fourth resonant inductor L4 in FIG. 1 is connected to the ground by means of a TRAP PAD gold wire, the Backvia part corresponds to the back hole in FIG. 1, the CAP part in FIG. 3 corresponds to the capacitor C2 in FIG. 1, the capacitor connected to TRAP corresponds to C1, and OUT in FIG. 3 is a PA output terminal.

It should be noted that the embodiments described above with reference to the accompanying drawings are only used for explaining the present invention, and are not used for limiting the scope of the present invention. Those ordinarily skilled in the art would appreciate that all modifications or equivalent substitutions made without deviating from the spirit and scope of the present invention should also fall within the scope of the present invention. In addition, unless otherwise specified in the article, terms in singular form include the plural form, vice versa. Moreover, unless otherwise particularly stated, any embodiment can be partially or entirely incorporated into part or all of any other embodiments for use.

What is claimed is:

1. A circuit structure for improving harmonic suppression capability of a radio frequency power amplifier, comprising an output stage unit, a high-order harmonic suppression unit, and a low-order harmonic suppression unit, wherein:
    the output stage unit outputs a signal to be subjected to harmonic suppression;
    the high-order harmonic suppression unit comprises a first filter capacitor and a back hole and is used for suppressing fifth and higher harmonics;
    the output stage unit and the first filter capacitor are connected to a ground in series via the back hole; and
    the low-order harmonic suppression unit is electrically connected to the output stage unit to suppress second, third and fourth harmonics;
    wherein the low-order harmonic suppression unit comprises a second filter capacitor, a fourth resonant inductor, a first matching inductor, a second matching inductor, a third matching inductor, a first matching capacitor, a second matching capacitor, a third matching capacitor, a first resonant inductor, a second resonant inductor, and a third resonant inductor, wherein:
    the second filter capacitor is connected to the ground in series via the fourth resonant inductor; the first matching inductor is connected to the output stage unit and the first matching inductor, the second matching inductor and the third matching inductor is connected in series to an output terminal;
    the first matching capacitor and the first resonant inductor are connected to the ground in series and are connected between the first matching inductor and the second matching inductor in parallel;
    the second matching capacitor and the second resonant inductor are connected to the ground in series and are connected between the second matching inductor and the third matching inductor in parallel; and
    the third matching capacitor and the third resonant inductor are connected to the ground in series and are connected between the third matching inductor and the output terminal in parallel.

2. The circuit structure for improving the harmonic suppression capability of a radio frequency power amplifier according to claim 1, wherein the first filter capacitor is arranged at the back hole.

3. The circuit structure for improving the harmonic suppression capability of a radio frequency power amplifier according to claim 1, wherein the output stage unit, the high-order harmonic suppression unit and the second filter capacitor are arranged in a chip die.

4. The circuit structure for improving the harmonic suppression capability of a radio frequency power amplifier according to claim 1, wherein the fourth resonant inductor is realized by using a gold wire.

5. A method for suppressing harmonics by using the circuit structure for improving the harmonic suppression capability of a radio frequency power amplifier, comprising the following steps:
    Step 1: suppressing high-order harmonic, in which the output stage unit and the first filter capacitor of the radio frequency power amplifier are connected to the ground in series via the back hole, and the first filter capacitor and the back hole constitute an in-chip resonant network to suppress fifth and higher harmonics of the radio frequency power amplifier;
    Step 2: suppressing low-order harmonic, in which the low-order harmonic suppression unit is connected to the output stage unit to suppress second, third and fourth harmonics;
    wherein in the step of suppressing low-order harmonic, the low-order harmonic suppression unit comprises a second filter capacitor, a fourth resonant inductor, a first matching inductor, a second matching inductor, a third matching inductor, a first matching capacitor, a second matching capacitor, a third matching capacitor, a first resonant inductor, a second resonant inductor and a third resonant inductor; and the step of suppressing low-order harmonic comprises:
    suppressing fourth harmonic, in which the second filter capacitor is connected to the ground in series via the fourth resonant inductor, the second filter capacitor and the fourth resonant inductor constitute a resonant network to suppress the fourth harmonics, the first matching inductor is connected to the output stage unit, and the first matching inductor, the second matching inductor and the third matching inductor are connected in series to an output terminal;

suppressing second harmonic, in which the first matching capacitor and the first resonant inductor are connected to the ground in series and are connected between the first matching inductor and the second matching inductor in parallel; the second matching capacitor and the second resonant inductor are connected to the ground in series and are connected between the second matching inductor and the third matching inductor in parallel; the second harmonics are suppressed by means of the first matching capacitor, the first resonant inductor, the second matching capacitor and the second resonant inductor which resonate at a second-order harmonic frequency point; and suppressing third harmonic, in which the third matching capacitor and the third resonant inductor are connected to the ground in series and are connected between the third matching inductor and the output terminal in parallel, and the third harmonics are suppressed by means of the third matching capacitor and the third resonant inductor which resonate at a third-order harmonic frequency point.

6. The method according to claim 5, wherein in the step of suppressing high-order harmonic, the first filter capacitor is arranged at the back hole.

7. The method according to claim 5, wherein the output stage unit, the high-order harmonic suppression unit and the second filter capacitor are arranged on a chip.

8. The method according to claim 5, wherein the fourth resonant inductor is realized by using a gold wire.

* * * * *